(12) United States Patent
Lin et al.

(10) Patent No.: US 9,640,497 B1
(45) Date of Patent: May 2, 2017

(54) SEMICONDUCTOR BACKMETAL (BM) AND OVER PAD METALLIZATION (OPM) STRUCTURES AND RELATED METHODS

(71) Applicant: SEMICONDUCTOR COMPONENTS INDUSTRIES, LLC, Phoenix, AZ (US)

(72) Inventors: Yusheng Lin, Phoenix, AZ (US); Takashi Noma, Ota (JP); Shinzo Ishibe, Oizumi-machi (JP)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/198,859

(22) Filed: Jun. 30, 2016

(51) Int. Cl.
*H01L 23/00* (2006.01)
*H01L 21/304* (2006.01)
(Continued)

(52) U.S. Cl.
CPC ............ *H01L 24/05* (2013.01); *H01L 21/265* (2013.01); *H01L 21/304* (2013.01); *H01L 21/324* (2013.01); *H01L 24/03* (2013.01); *H01L 2224/022* (2013.01); *H01L 2224/0219* (2013.01); *H01L 2224/02181* (2013.01); *H01L 2224/0345* (2013.01); *H01L 2224/03464* (2013.01); *H01L 2224/05083* (2013.01); *H01L 2224/05124* (2013.01); *H01L 2224/05139* (2013.01); *H01L 2224/05147* (2013.01); *H01L 2224/05155* (2013.01);
(Continued)

(58) Field of Classification Search
USPC .......................................................... 438/530
See application file for complete search history.

(56) References Cited

U.S. PATENT DOCUMENTS

2012/0202320 A1* 8/2012 Feng ................. H01L 24/11
438/113
2015/0348936 A1* 12/2015 Lin .................. H01L 23/552
257/659

OTHER PUBLICATIONS

IXYS Corporation, "Trench XPT IGBT Chip—IX112T06M-AG," published at least as early as 2013 by IXYS, available online at http://ixapps.ixys.com/DataSheet/IX112T06M-AG.pdf, last visited Jun. 23, 2016.

(Continued)

*Primary Examiner* — Zandra Smith
*Assistant Examiner* — Lawrence Tynes, Jr.
(74) *Attorney, Agent, or Firm* — Adam R. Stephenson, Ltd.

(57) ABSTRACT

A method of forming semiconductor devices includes providing a wafer having a first side and second side, electrically conductive pads at the second side, and an electrically insulative layer at the second side with openings to the pads. The first side of the wafer is background to a desired thickness and an electrically conductive layer is deposited thereon. Nickel layers are simultaneously electrolessly deposited over the electrically conductive layer and over the pads, and diffusion barrier layers are then simultaneously deposited over the nickel layers. Another method of forming semiconductor devices includes depositing backmetal (BM) layers on the electrically conductive layer including a titanium layer, a nickel layer, and/or a silver layer. The BM layers are covered with a protective coating and a nickel layer is electrolessly deposited over the pads. A diffusion barrier layer is deposited over the nickel layer over the pads, and the protective coating is removed.

15 Claims, 7 Drawing Sheets

(51) Int. Cl.
*H01L 21/265* (2006.01)
*H01L 21/324* (2006.01)
(52) U.S. Cl.
CPC ............... *H01L 2224/05166* (2013.01); *H01L 2924/01047* (2013.01); *H01L 2924/01079* (2013.01); *H01L 2924/07025* (2013.01); *H01L 2924/1203* (2013.01); *H01L 2924/13055* (2013.01)

(56) References Cited

OTHER PUBLICATIONS

Vishay Intertechnology, Inc., "Diodes VBUS03B1-SD0 and VCUT03E1-SD0: BiSy Single-Line ESD Protection Diodes Feature Low Working Range of 3.3 V," published at least as early as Jun. 23, 2016, available online at http://www.vishay.com/docs/48043/48043.pdf, last visited Jun. 23, 2016.

* cited by examiner

SEMICONDUCTOR BACKMETAL (BM) AND OVER PAD METALLIZATION (OPM) STRUCTURES AND RELATED METHODS

BACKGROUND

1. Technical Field

Aspects of this document relate generally to semiconductor wafer and device processing methods.

2. Background

Semiconductor fabrication processes may involve many steps. In some processes a wafer receives one or more layers, such as electrically conductive layers. Electrically conductive layers may be used to provide electrical contact areas of individual semiconductor devices singulated from the wafer. Electrically conductive layers may include one or more backmetal (BM) layers at a backside of the wafer and one or more over pad metallization (OPM) layers at a top side of the wafer.

SUMMARY

Implementations of methods of forming a plurality of semiconductor devices may include: providing a semiconductor wafer (wafer) having a first side and a second side opposite the first side, one or more electrically conductive pads coupled at the second side, and one or more electrically insulative layers coupled at the second side and having one or more openings providing access to the one or more electrically conductive pads; backgrinding the first side of the wafer to a desired thickness; depositing an electrically conductive layer on the first side of the wafer; simultaneously electrolessly depositing a first nickel layer over the electrically conductive layer and a second nickel layer over the one or more electrically conductive pads, and; simultaneously depositing a first diffusion barrier layer over the first nickel layer and a second diffusion barrier layer over the second nickel layer.

Implementations of methods of forming a plurality of semiconductor devices may include one, all, or any of the following:

Backgrinding the first side of the wafer may include forming a substantially circular recess in the first side of the wafer bounded by a ring of non-removed material.

The first diffusion barrier layer and the second diffusion barrier layer each may include electrolessly deposited gold and/or electrolessly deposited silver.

The first diffusion barrier layer and the second diffusion barrier layer each may include an organic solderability preservative (OSP).

The one or more electrically insulative layers may include polyimide.

Introducing dopants into the wafer through the first side of the wafer and annealing the wafer.

The electrically conductive layer may include AlCu.

Forming a plurality of insulated gate bipolar transistors (IGBTs) and/or a plurality of diodes on the wafer.

Implementations of methods of forming a plurality of semiconductor devices may include: providing a semiconductor wafer (wafer) having a first side and a second side opposite the first side, one or more electrically conductive pads coupled at the second side, and one or more electrically insulative layers coupled at the second side and having one or more openings providing access to the one or more electrically conductive pads; backgrinding the first side of the wafer to a desired thickness; depositing an electrically conductive layer on the first side of the wafer; depositing one or more backmetal (BM) layers on the electrically conductive layer, the one or more BM layers including a titanium layer, a nickel layer, and/or a silver layer; covering the one or more BM layers with a protective coating; electrolessly depositing a nickel layer over the one or more electrically conductive pads; depositing a diffusion barrier layer over the nickel layer, and; removing the protective coating from the one or more BM layers.

Implementations of methods of forming a plurality of semiconductor devices may include one, all, or any of the following:

The one or more BM layers may include a titanium layer, a nickel layer, and/or a silver layer.

The diffusion barrier layer may include electrolessly deposited gold, electrolessly deposited silver, and/or an organic solderability preservative (OSP).

Introducing dopants into the wafer through the first side of the wafer.

The electrically conductive layer may include evaporated aluminum.

The protective coating may include an adhesive tape.

Depositing the one or more BM layers through evaporation.

Implementations of semiconductor devices may include: a semiconductor layer having a first side and a second side opposite the first side; one or more electrically conductive pads coupled at the second side; one or more electrically insulative layers coupled at the second side and having one or more openings providing access to the one or more electrically conductive pads; an electrically conductive layer coupled on the first side of the semiconductor layer; one or more backmetal (BM) layers coupled on the electrically conductive layer; one or more over-pad metallization (OPM) layers coupled over the one or more electrically conductive pads, the one or more OPM layers including a nickel layer, and; a diffusion barrier layer coupled over the one or more OPM layers; wherein the semiconductor device includes an insulated gate bipolar transistor (IGBT) and/or a diode.

Implementations of semiconductor devices may include one, all, or any of the following:

The one or more BM layers may include a nickel layer.

The one or more BM layers may include a titanium layer and a silver layer.

The diffusion barrier layer may include electrolessly deposited gold, electrolessly deposited silver, and/or an organic solderability preservative (OSP).

The electrically conductive layer may include evaporated aluminum.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended semiconductor backmetal (BM) and over pad metallization (OPM) structures and related methods will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such semiconductor backmetal (BM) and over pad metallization (OPM) structures and related methods, and implementing components and methods, consistent with the intended operation and methods.

Figure 1:
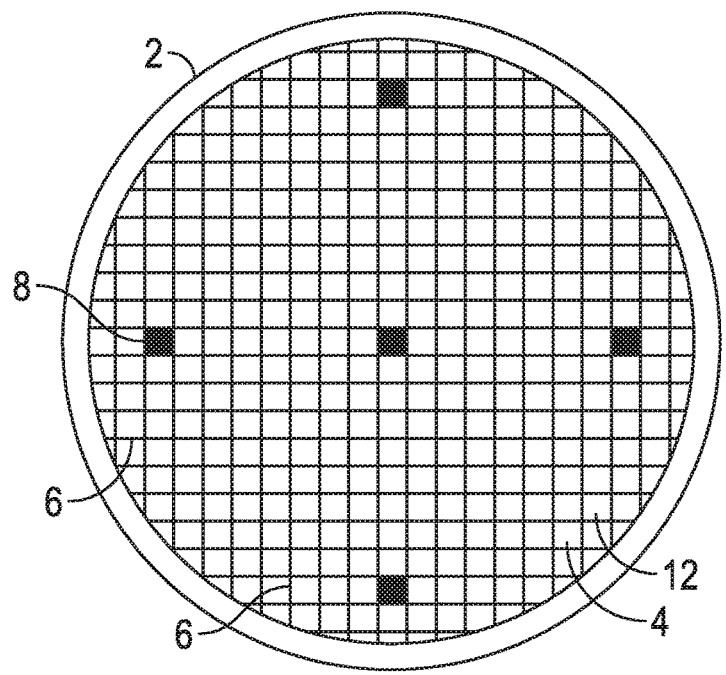
FIG. 1 is a top view of a semiconductor wafer having a number of semiconductor devices thereon.
Figure 2:
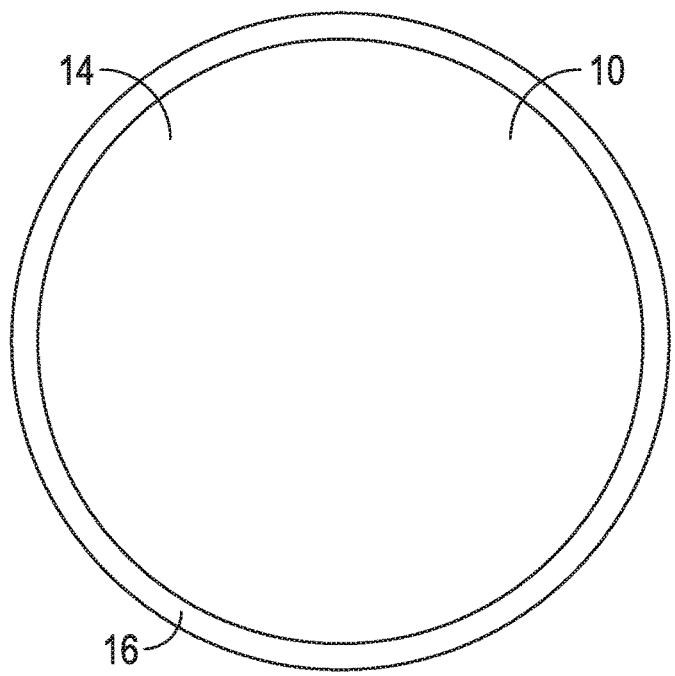
FIG. 2 is a bottom view of the semiconductor wafer of FIG. 1.
Figure 3:
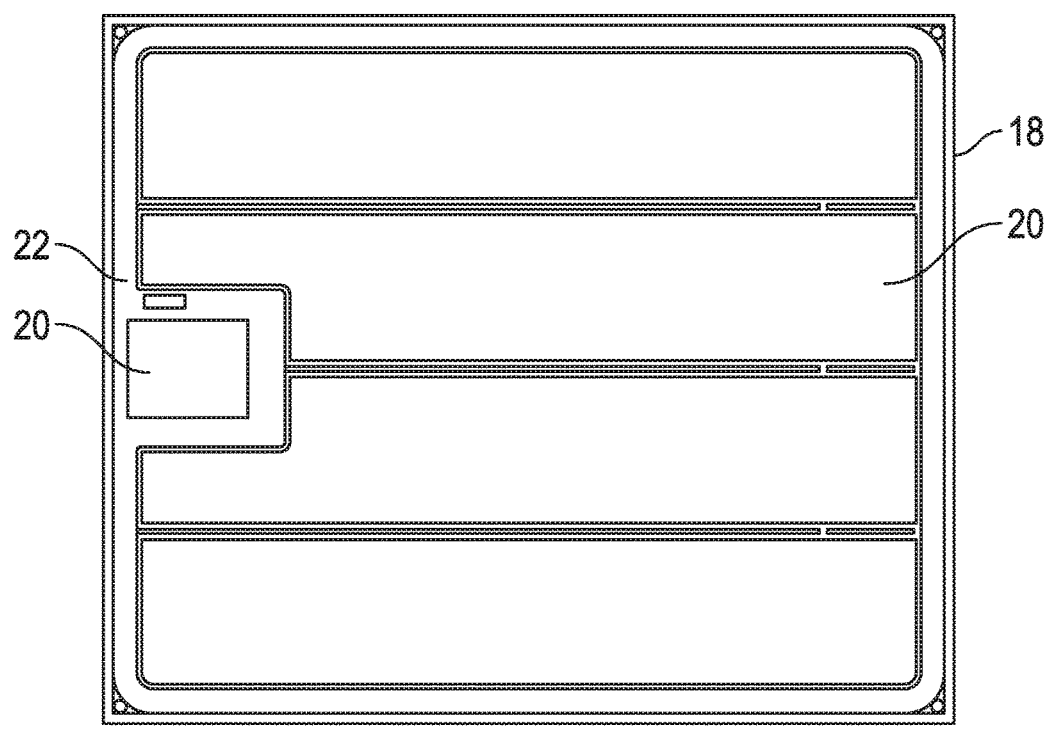
FIG. 3 is a top view of an insulated-gate bipolar transistor (IGBT)
Figure 4:
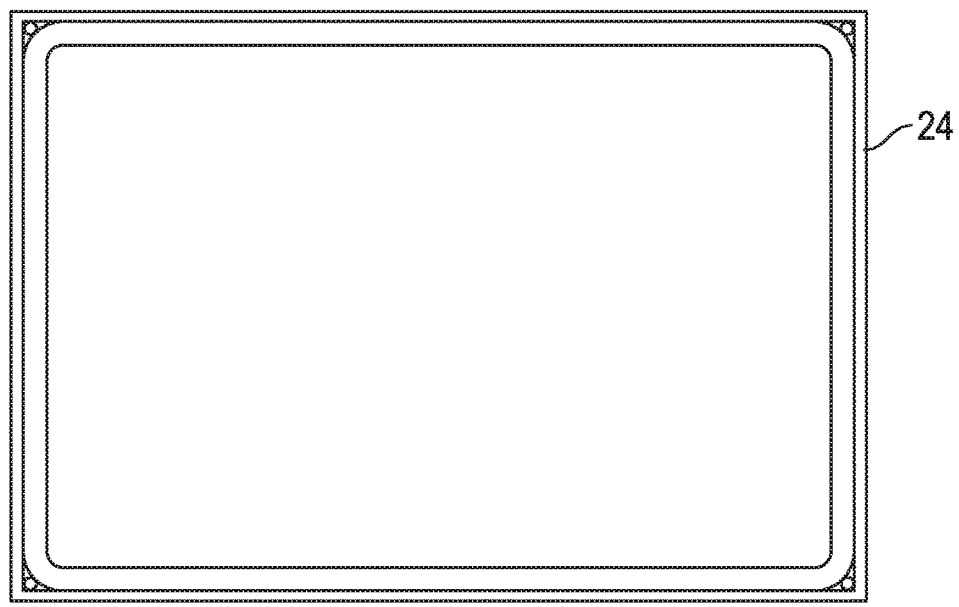
FIG. 4 is a top view of a diode.

Referring now to FIGS. 1-2, an implementation of a semiconductor wafer (wafer) 2 is shown. The wafer is not yet singulated and includes a first side 10 and a second side 12. A number of semiconductor devices 4 are included on the second side and may include, by non-limiting example, insulated gate bipolar transistors (IGBTs) 18 as shown in FIG. 3 or diodes 24 as shown in FIG. 4. The semiconductor devices could include other power devices such as metal-oxide-semiconductor field-effect transistors (MOSFETs), GaN devices, SiC devices, and may be used to form intelligent power modules (IPMs), power integrated modules (PIMs), and so forth. IGBTs will include electrically conductive areas 20 and electrically insulative areas 22 corresponding with the second side 12 of the wafer. If the semiconductor devices are diodes they may, by non-limiting example, be fast recovery diodes (FRDs). The IGBTs may include in various implementations 650 volt, 200 amp IGBTs, and/or the diodes may include 650 volt, 200 amp fast recovery diode rectifiers though other devices may apply the principles disclosed herein as well.

Singulation lines 6 show saw streets or the like which will be used to singulate individual semiconductor devices from the wafer using any singulation techniques such as sawing, laser drilling, punching, and so forth. A number of test areas (process control monitors (PCMs)) 8 or otherwise inactive areas may be included on the wafer—in implementations these may be used to test the operability of the individual semiconductor devices and/or may otherwise be used for handling of the wafer during processing (and/or the saw street areas may include test areas).

FIG. 2 shows a recess 14 in the first side 10 of the wafer within a ring 16 of non-removed material. The recess was formed through backgrinding using a process marketed under the trade name TAIKO process by DISCO of Tokyo, Japan. The backgrinding leaves a ring of non-removed material (TAIKO ring) which may help to prevent the wafer from curling or otherwise bending during processing but may at the same time thin most of the backside of the wafer so that doping may be done through the backside (first side) of the wafer. In other implementations of methods of forming semiconductor devices the TAIKO process may not be used, but some other backgrinding or other material-removal technique may be used (or may be excluded) and/or doping may occur through the second side instead, eliminating the need for backgrinding or material removal before doping. The wafer in implementations may be background or otherwise reduced in thickness to as small a size as 75 microns.

Figure 5:
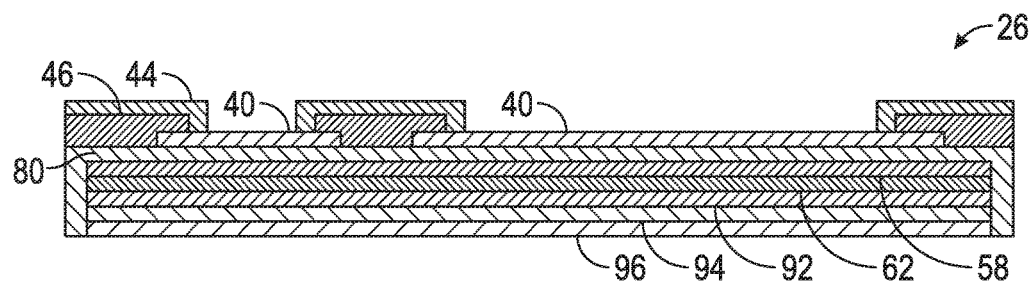
FIG. 5 is a side cross-section view of an implementation of a semiconductor assembly.
Figure 6:
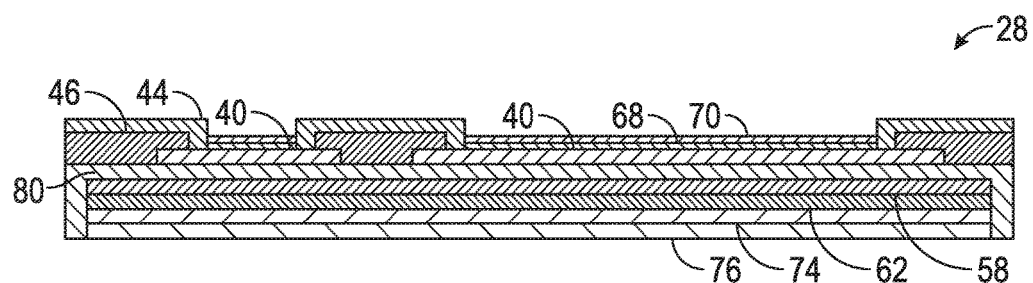
FIG. 6 is a side cross-section view of another implementation of a semiconductor assembly.
Figure 7:
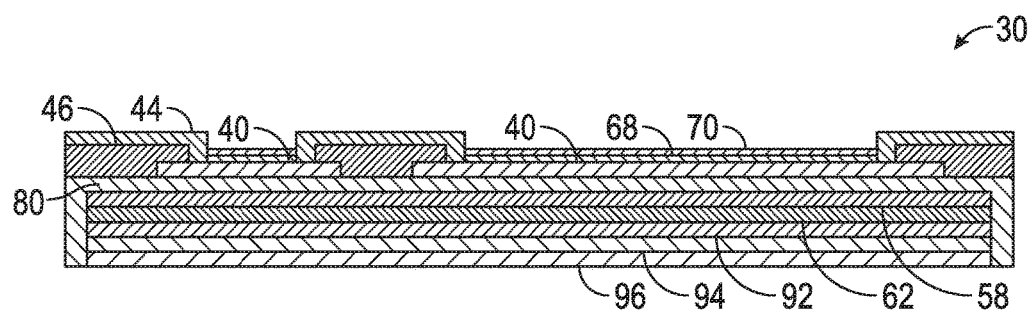
FIG. 7 is a side cross-section view of another implementation of a semiconductor assembly.

FIGS. 5-7 show three examples of semiconductor assemblies that may be formed using processes described herein. FIG. 5 shows a conventional assembly 26 which includes a silicon semiconductor layer 80 atop which are electrically conductive pads (pads) 40 and one or more electrically insulative layers including a polyimide (PI) layer 44 and an oxi-nitride layer 46. In implementations the PI layer may be excluded and/or the oxi-nitride layer could be replaced by some other electrically insulative layer. In implementations in which the PI layer is included it could be nine microns, or about nine microns, thick. The PI layer may be formed of a non-photosensitive polyimide such as, by non-limiting example, a polyimide sold under the trade name SP-483 by Toray Industries, Inc. of Tokyo, Japan. Any suitable insulative material(s) may be used for the electrically insulative layer(s), however, and this is only an example.

The electrically insulative layer(s) include one or more openings providing access to the pads 40 as can be seen in FIG. 5. The pads, electrically insulative layers, and openings may be formed using any material deposition and removal techniques such as electro-plating, electroless plating, spinning, sputtering, evaporation, chemical vapor deposition (CVD), physical vapor deposition (PVD), etching, masking, photolithography techniques, and the like.

The pads 40 in all implementations shown in the drawings are formed of either AlSi or AlCu, though in other implementations they could be formed of any other electrically conductive materials. The pads may be themselves formed over other conductive pads in (or on) the semiconductor layer, and so may themselves be termed "top metal" layers or over pad metallization (OPM) layers. The pads in the conventional assembly of FIG. 5 are formed of AlSi.

It is also noted that FIG. 5 (along with FIGS. 6-7 and many of the other drawings) shows a very simplified view of the semiconductor wafer for ease of viewing. For example, the cross-section shown in FIG. 5 purports to show a cross-section of the entire wafer (as the entire cross-section of the recess 14 and TAIKO ring are illustrated) yet only two pads are seen in the cross section. In reality, as may be seen from FIGS. 1-2, a full cross-section of the wafer taken at any location is more likely to reveal dozens to hundreds or even thousands of pads. Nevertheless, for ease in viewing the different layers and elements the simplified view is presented in the drawings.

FIG. 5 shows that the semiconductor layer 80 includes a recess, which was formed through a TAIKO process as previously described. A doped region 58 is included. Dopants may be introduced by any doping technique such as implantation, deposition and diffusion, and the like. One or more dopants such as boron, phosphorous, and so forth may be used (the dopant(s) may be selected depending on the semiconductor substrate such as silicon, GaAs, and so forth). Over the doped region an electrically conductive layer 62 has been formed. Backmetal (BM) layers are then formed including a titanium layer 92, a nickel layer 94 and a silver layer 96. The BM layers are shown in a specific configuration (titanium over the electrically conductive layer, nickel over the titanium layer, and silver over the nickel layer), though in other implementations other configurations could be used. The bottommost layer, however, provides a diffusion barrier to prevent nickel from diffusing into a solder in the event that a solder is used to electrically and mechanically couple the bottommost metal layer with some other element.

Throughout this disclosure the term "over" is used with respect to various layers and elements. This term is not meant to convey position, up or down, in the drawings, but is meant to convey a relative outer position. For example, using the up (above) and down (below) directions of FIG. 5, a layer placed above the pads would be "over" the pads, and a layer placed below the electrically conductive layer would similarly be "over" the electrically conductive layer. The term "over" is not meant to convey that an element is directly in contact with the element which it is "over." For example, an intermediary layer may be coupled directly with the pads and a secondary layer may be coupled directly with the intermediary layer and, although the secondary layer may not directly contact the pads, the secondary layer will nevertheless be coupled "over" the pads as it will be a more outer layer relative to the pads.

The conventional assembly 26 thus has over pad metallization (OPM) which includes AlSi and backmetal (BM) layers which include titanium, nickel, and silver layers over an electrically conductive layer.

An assembly similar to assembly 26, but specifically using AlCu for the pads 40 instead of AlSi, and using AlCu as the material for the electrically conductive layer 62, is not shown in the drawings. Nevertheless, the use of AlCu is found to have better aluminum wedge bonding control, and so in some ways is advantageous compared with the use of AlSi. When a TAIKO ring process is used, there is generally a sloped portion and/or a stepped portion between the center of the recess and the outermost ring, and AlCu has been found to have good bonding with the wafer despite the angled and sloped portions, the differences in slope, etc.

In experiments AlCu thicknesses for the electrically conductive layer varied depending on the specific location. For example, in some cases AlCu was sputtered onto the first side of the wafer after the TAIKO process was used, so that in the bottommost portion of the recess the AlCu was 1.4 microns thick, at a first sloped portion closest to the recess the AlCu was 1.3 microns thick, at a flat portion between the recess and the ring the AlCu ranged from 1.4 microns to 1.3 microns thick, at a second sloped/curved portion between the flat portion and the ring the AlCu ranged from 0.8 microns to 1.3 microns thick, and at the ring itself the AlCu was about 1.3 microns thick. In a second experiment the AlCu thickness ranged from 1.5 microns to 2.0 microns, and in a third experiment it ranged from 2.6 microns to 3.2 microns. In the first experiment a target AlCu thickness was 1.5 microns, in the second experiment a target thickness of 2 microns was used, and in the third experiment a target thickness of 3 microns was used. In each case there was found no peeling around the wafer edge, and good step coverage of AlCu for the area between the recess and the ring, so that any of these thicknesses could be used for the electrically conductive layer when AlCu is used as the material of choice. Each of these experiments further included annealing steps after AlCu sputtering and then electroless plating of Ni/Au which will be described hereafter. As described above, the use of AlCu instead of AlSi may result in better aluminum wedge bonding control.

FIG. 6 illustrates an assembly 28 that is in some ways similar to assembly 26. At the backside (first side) of the wafer, instead of BM layers of titanium, nickel, and silver, a nickel layer 74 is deposited over the electrically conductive layer and then a diffusion barrier layer 76 is deposited over the nickel layer. At the top side (second side) a nickel layer 68 is deposited over the pads 40 and a diffusion barrier layer 70 is deposited over this nickel layer.

FIG. 7 illustrates an assembly 30 that is in some ways similar to assembly 26. At the backside (first side) of the wafer, the layers are the same, but at the top side (second side) a nickel layer 68 is deposited over the pads 40 and a diffusion barrier layer 70 is deposited over this nickel layer.

Figure 8:
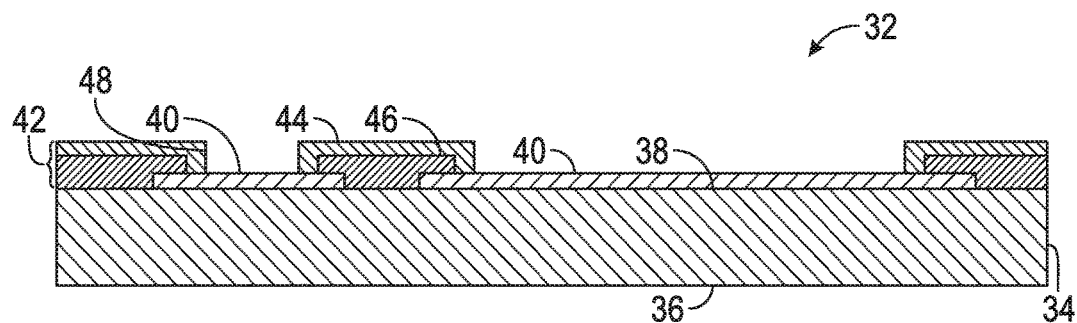
FIG. 8 is a side cross-section view of an implementation of a semiconductor assembly formed in the formation of the semiconductor assemblies of FIGS. 5-7.
Figure 9:
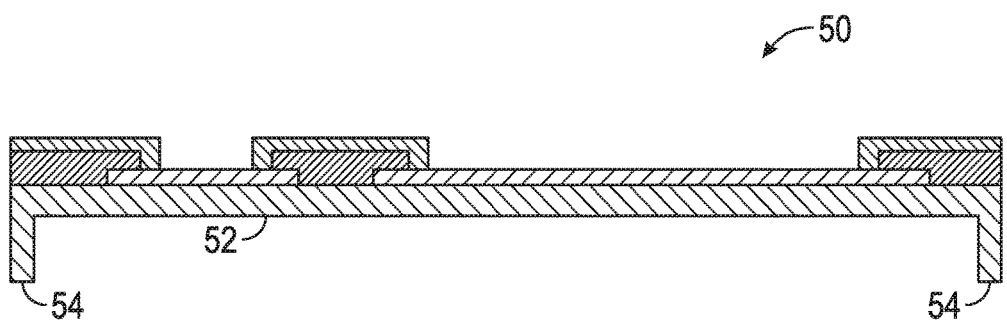
FIG. 9 is a side cross-section view of an implementation of a semiconductor assembly formed in the formation of the semiconductor assembly of FIG. 6.
Figure 10:
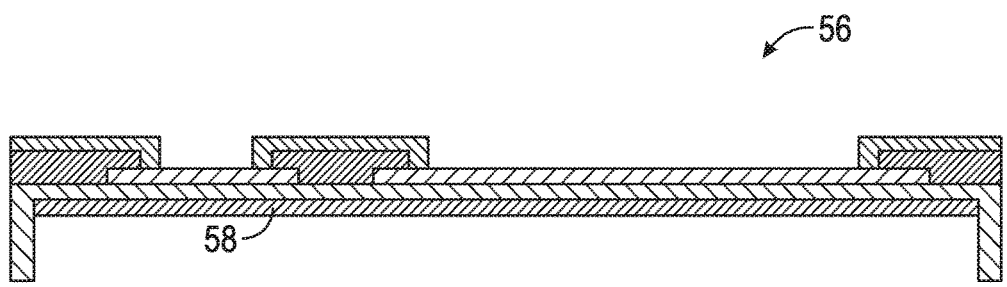
FIG. 10 is a side cross-section view of another semiconductor assembly formed in the formation of the semiconductor assembly of FIG. 6.

FIGS. 8-13 representatively illustrate processing steps (and intermediate assemblies) used/formed in the formation of the assembly of FIG. 6. FIGS. 8-10 illustrate steps and intermediate assemblies that are also used/formed in the formation of the assembly of FIG. 7.

Referring to FIG. 8, assembly 32 includes a semiconductor wafer 34 having a first side (bottom side or backside) 36 and a second side (top side) 38 opposite the first side. One or more electrically conductive pads (pads) 40 are included. In this example the pads are formed of AlCu though they could be formed of other electrically conductive materials, such as AlSi as previously described, or other materials. One or more electrically insulative layers 42 are included, and in the implementation shown include an oxy-nitride layer 46 coupled at the second side of the wafer and a polyimide (PI) layer 44 coupled over the oxy-nitride layer, though other materials could be used as described previously and/or the PI layer could be excluded. In the representative example the PI layer has a thickness of, or of about, nine microns, and the semiconductor wafer is formed of silicon. The one or more electrically insulative layers 42 include one or more openings 48 providing access to the pads. There are two such openings shown in FIG. 8.

Referring to FIG. 9, a TAIKO grinding process is performed on assembly 32 to form assembly 50, which has a recess 52. In the implementation shown the recess is a substantially circular recess and is bounded by a ring 54 of non-removed material. As described previously, the TAIKO process could be excluded and a backgrinding process could be used which backgrinds the entire first side of the wafer (without leaving a ring of non-removed material), or the backgrinding could be excluded altogether. In implementations in which one or more grinding or material removal processes is undertaken at the first side of the wafer, doping may be done into the wafer through the first side of the wafer after the material removal. In implementations in which the backgrinding or material removal is excluded, the doping may have occurred previous to the deposition of the pads and one or more electrically insulative layers and could accordingly be done through the second side of the wafer.

FIG. 10 thus shows an assembly 56 which is formed from assembly 50. Assembly 56 includes a doped region 58. Doping may include boron, phosphorous, and/or other III/V combinations, and/or any other dopant materials depending on the semiconductor material (Si, GaAs, etc.) to achieve proper electrical properties as desired. For example, a first implantation of either boron or phosphorous could be done, then a second implantation of the other of the two, to achieve proper junction and/or electrical properties. After doping a first annealing process is carried out at 450 degrees Celsius to achieve desired distribution/movement of the dopant materials. The doping may be done using any method such as deposition and diffusion, implantation, etc., and in the implementation shown is done through implantation.

Figure 11:
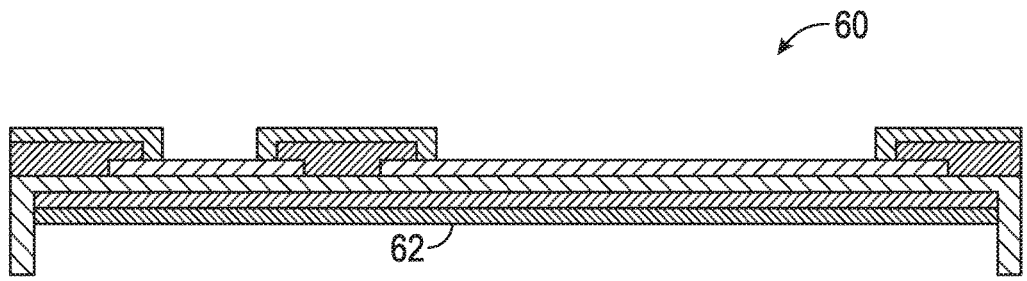
FIG. 11 is a side cross-section view of another semiconductor assembly formed in the formation of the semiconductor assembly of FIG. 6.

FIG. 11 shows an assembly 60 which is formed from assembly 56. Assembly 60 includes the electrically conductive layer 62. In the implementation shown this layer is a 2 micron thick layer of sputtered AlCu, and a second annealing process is done after sputtering at 360 degrees Celsius. The second annealing process may help to form a strong bond between the electrically conductive layer and/or may result in desired diffusion of some of the AlCu into the doped region and/or may further distribute/move the dopants in the doped region as desired. The sputtered AlCu layer may provide a bonding layer between the silicon wafer and the BM layers of nickel and/or other materials that will later be deposited.

Figure 12:
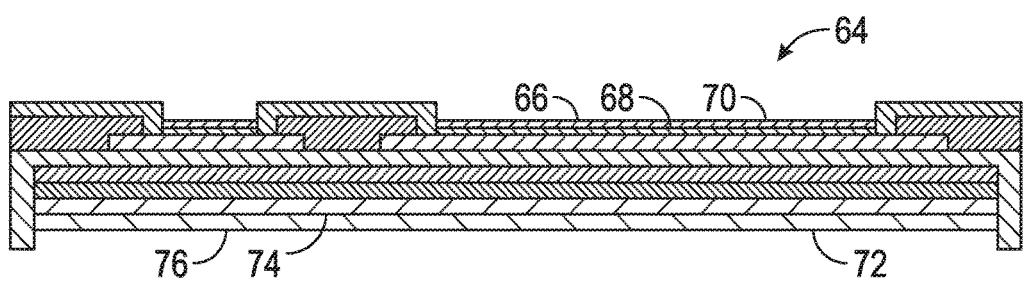
FIG. 12 is a side cross-section view of another semiconductor assembly formed in the formation of the semiconductor assembly of FIG. 6.

FIG. 12 shows an assembly 64 which is formed from assembly 60. Assembly 64 includes backmetal (BM) layers 72 including a nickel layer (first nickel layer) 74 and a diffusion barrier layer (first diffusion barrier layer) 76, as well as over pad metallization (OPM) layers 66 including a nickel layer (second nickel layer) 68 and a diffusion barrier layer (second diffusion barrier layer) 70. The nickel layers are electrolessly deposited at the same time, so that the first nickel layer and second nickel layer are simultaneously deposited. The diffusion barrier layers may also be simultaneously deposited. The diffusion barrier layers could include a number of materials, such as gold (a gold layer), silver (a silver layer), and/or an organic solderability preservative (OSP). An OSP could be water based and could include compounds such as benzotriazoles, imidazoles, benzimidazoles, and so forth. In the implementation shown the first and second diffusion barrier layers are both formed of gold and are simultaneously electrolessly deposited over the respective nickel layers. Diffusion barrier layers formed of silver could similarly be electrolessly deposited simultaneously.

The diffusion barrier layers help to prevent nickel from diffusing into solder that is later coupled over the pads or over the BM layers, and accordingly make the top metal (TM) solderable to form a solderable top metal (STM). When the BM layers are formed of the same materials as the TM layers they are of course also solderable. Thicker Ni metal layers may also be useful for increasing reliability such as, by non-limiting example, in some automotive applications (and/or other industrial and/or white goods applications). Additional materials could be used between the nickel layer and diffusion barrier layer at the top side or bottom side. For example, a palladium (Pd) layer could be included between a nickel layer and a gold layer on the top side and/or the bottom side to create a Ni/Pd/Au structure, and all three of these layers in each case could be electrolessly deposited (simultaneously depositing both nickel layers, then simultaneously depositing both palladium layers, then simultaneously depositing both gold layers).

Figure 13:
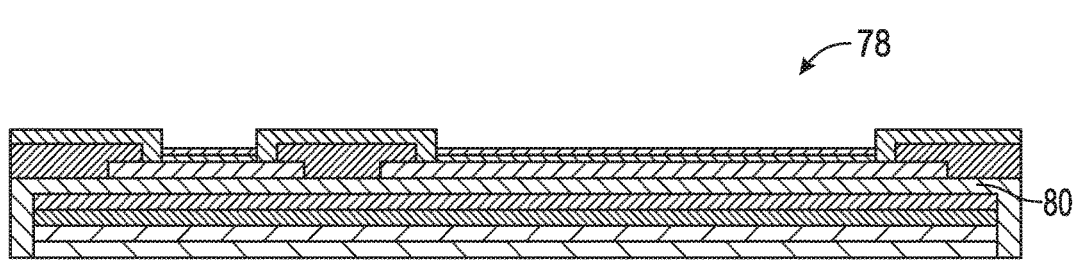
FIG. 13 is a side cross-section view of an implementation of a semiconductor assembly that has the same structure as the assembly of FIG. 6.

FIG. 13 shows an assembly 78 which is formed from assembly 64. Assembly 78 has the bottom portions of the TAIKO rings removed, such as through sawing. The semiconductor layer 80 that remains thus includes a horizontal portion and a vertical ring, still, and this structure may be singulated using any singulation techniques to form the individual semiconductor devices. The assembly 78 of FIG. 13 thus has the same structure as that of assembly 28 shown in FIG. 6. It is thus possible to create a double sided Ni/Au or Ni/Pd/Au structure through two or three steps of simultaneous electroless deposition.

In experiments of creating IGBT structures using double sided Ni/Au OPM/BM layers the AlCu BM layer ranged between 2 microns and 3 microns and the wafers were examined before and after cleaning with hydrofluoric (HF) acid. Experiments showed good electroless Ni/Au coverage of both the wafer topside and backside. In experiments of creating diode rectifier structures using double sided Ni/Au OPM/BM layers the AlCu BM layer ranged between 2 microns and 3 microns and the wafers were examined before and after cleaning with hydrofluoric (HF) acid. Experiments showed good electroless Ni/Au coverage of both the wafer topside and backside with some lack of coverage around the PCM and scribe line areas (though such lack of coverage would not affect operation of singulated devices).

In a first experiment in which the AlCu BM layer target thickness was 1.5 microns and ranged between 0.8-1.4 microns the Au/Ni layers combined had a thickness ranging from 1.6 microns to 2.2 microns, and at wafer center the AlCu BM layer was 1.3 microns thick and the Au/Ni layers combined had a thickness of 1.6 microns. In a second experiment in which the AlCu BM layer target thickness was 2.0 microns and ranged between 1.5-2.0 microns the Au/Ni layers combined had a thickness ranging from 1.7 microns to 2.2 microns, and at wafer center the AlCu BM layer was 1.8 microns thick and the Au/Ni layers combined had a thickness of 1.7 microns. In a third experiment in which the AlCu BM layer target thickness was 3.0 microns and ranged between 2.6-3.2 microns the Au/Ni layers combined had a thickness ranging from 1.7 microns to 2.4 microns, and at wafer center the AlCu BM layer was 3.0 microns thick and the Au/Ni layers combined had a thickness of 1.7 microns.

In each of these experiments there was good adhesion of the AlCu BM layer to the wafer over the entire TAIKO recess and ring structure (and good step coverage of the transitions therebetween) and between the Au/Ni layers and the AlCu layer, with no peeling in either case. The OPM layers could have similar Au/Ni thicknesses since they will be simultaneously electrolessly plated in some cases. While the layers could be deposited separately, simultaneously depositing them will in some implementations reduce processing time and cost. Furthermore, with the IGBT experiments no voids or spikes were observed in the AlCu, so that gate and emitter locations were properly formed without defects so as to result in proper IGBT function.

The use of Ni/Au or Ni/Pd/Au layers for the OPM and BM layers further allows for soldering or other bonding techniques to be used such as bondwire, clip, or other attachments, or the use of an electrically conductive adhesive, and so forth. Conventional structures, such as those using the AlSi or AlCu OPM only, do not allow for soldering because the thin device is not protected from solder diffusing thereinto. With the disclosed structures the device is protected from solder diffusing into the device due to the presence of a thick Ni layer.

Various sizes have thus been used for the Ni/Au layers. In some cases, the target thickness will be 1.2 microns or about 1.2 microns. It is expected that the thickness could increase up to 4-5 microns, or about 4-5 microns, without stress issues, and a range of 1-3 microns, or about 1-3 microns, may be a more conservative range to achieve proper solder protection and at the same time avoid stress issues. If the Ni/Au layer thickness is under 0.7 microns or under about 0.7 microns then the solder joint may include all of the nickel thickness and thus the nickel layer protection of the semiconductor device may be removed. In some implementations however the Ni/Au layer thickness may range from 0.5 microns to 3.0 microns, or about 0.5 microns to about 3.0 microns. Stress may have to be considered in some implementations because of the thinned nature of the center of the wafer since a top portion of the structure includes the entire wafer and a bottom portion of the structure has most of the wafer removed.

When a gold layer is included the gold prevents nickel oxidation. The gold layer may be only 300 Angstroms thick, or only about 300 Angstroms thick (with Ni or Ni/Pd taking up the remainder of the thickness of the Ni/Au or Ni/Pd/Au structure). In experiments the gold layer ranged from about 192 Angstroms to about 551 Angstroms thick, however, and in implementations any thickness within this range would work. The use of gold also protects the solder from nickel diffusing into it. Other materials, such as silver and OSP layers, such as those disclosed herein, may be used for the diffusion barrier layer and may achieve the same objectives.

Figure 14:
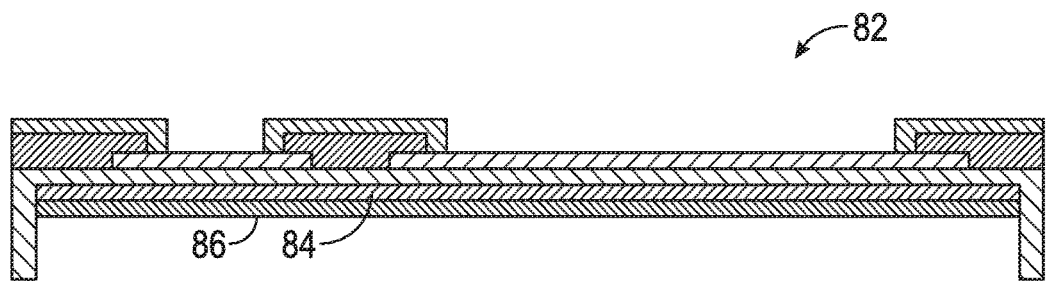
FIG. 14 is a side cross-section view of an implementation of a semiconductor assembly formed in the formation of the semiconductor assembly of FIG. 7.

The BM layers and TM/OPM layers could alternatively be formed of different materials. For example, FIGS. 8-10 and 14-19 may be used to illustrate a second process that is used to form the assembly 30 of FIG. 7. The process may begin, accordingly, with the steps described above in relation to FIGS. 8-10 including backgrinding, dopant implantation, and the first annealing step in the same manner as described above. FIG. 14 shows an assembly 82 which is formed from assembly 56. Assembly 82 thus has a doped region 84. This may be the same as doped region 58 in implementations, or it may be different in terms of dopants, thickness, etc. In the implementation shown doped region 84 is identical or very similar to doped region 58. An electrically conductive layer 86 is deposited over the doped region. Any electrically conductive material that bonds well to the semiconductor and provides a good bonding for the remainder of the BM layers, without causing stress issues, could be used. In the implementation shown the electrically conductive layer 86 is formed of evaporated aluminum. A second annealing process is then done at 360 degrees Celsius. This is similar to the second annealing process described above and may have the same objectives.

Figure 15:
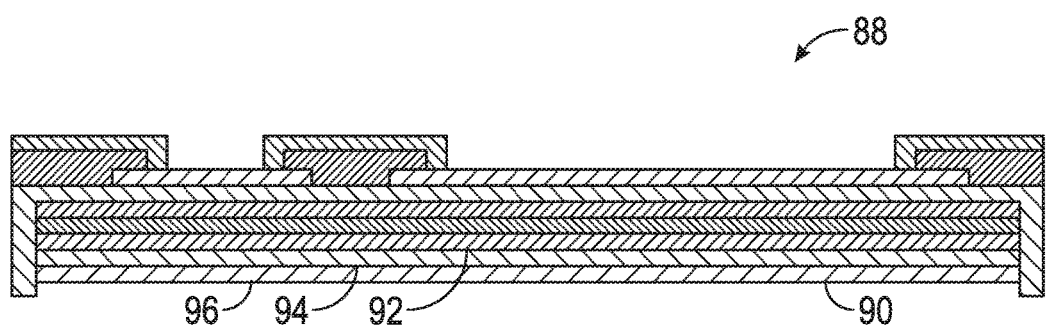
FIG. 15 is a side cross-section view of another semiconductor assembly formed in the formation of the semiconductor assembly of FIG. 7.

FIG. 15 shows assembly 88 which is formed from assembly 82. Assembly 88 has a number of backmetal (BM) layers 90 deposited over the aluminum layer, including a titanium layer 92, a nickel layer 94, and a silver layer 96. In the example shown these are deposited with the titanium layer over the aluminum layer, the nickel layer over the titanium layer, and the silver layer over the nickel layer. The titanium layer may prevent the nickel layer from diffusing into the aluminum layer (and may therefore be a diffusion barrier layer) and the silver layer may prevent the nickel from diffusing into a solder (and may therefore also be a diffusion barrier layer). Other configurations are possible, however, and other materials may be used. For example, the silver could be replaced with gold or an OSP layer.

The BM layers could be deposited such as through sputtering, an evaporation process, or electrodeposition. They could be electrolessly deposited, though this may entail one or more extra steps of protecting the top side pads so that they are not likewise plated with the metal layers. In the representative example the BM layers are not deposited electrolessly but are evaporated.

While the Ti/Ni/Ag structure for the BM layers is specifically shown, the BM layers could include other materials and or configurations such as, by non-limiting example: Ti/NiV/Ag, Ti/Ni/Cu, Ti/Ni/Cu/Ni, and the like. Different configurations will be applicable to different devices and/or bonding techniques. For example, the Ti/Ni/Ag structure is preferred when Ag sintering will be used during processing.

Figure 16:
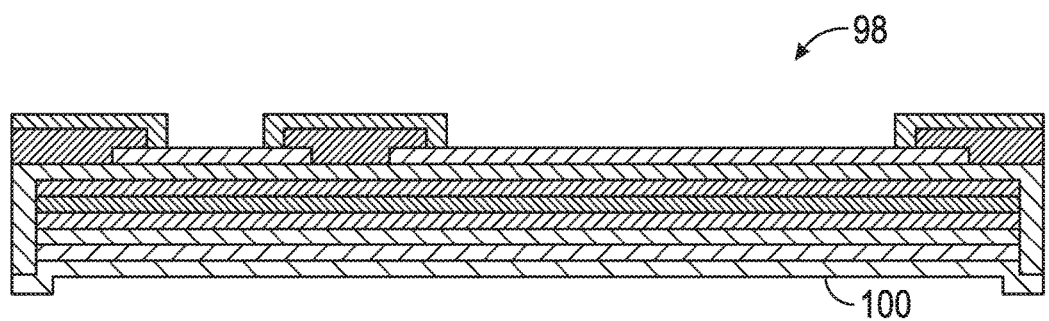
FIG. 16 is a side cross-section view of another semiconductor assembly formed in the formation of the semiconductor assembly of FIG. 7.

FIG. 16 shows assembly 98 which is formed from assembly 88. A protective coating 100 is used to cover the BM layers so that one or more OPM layers may be electrolessly deposited over the pads without being deposited over the BM layers. The protective coating could be a polymer, a tape, an organic layer, or the like. In the implementation shown it is an ultraviolet (UV) release tape or a tape sold under the trade name KAPTON by E.I. du Pont de Nemours and Company of Wilmington, Del.

Figure 17:
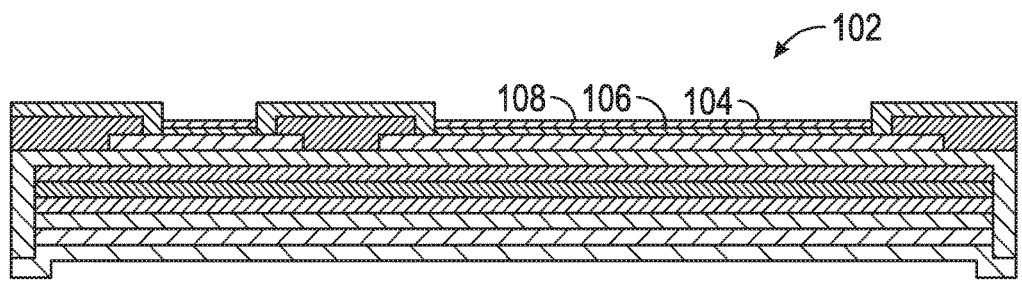
FIG. 17 is a side cross-section view of another semiconductor assembly formed in the formation of the semiconductor assembly of FIG. 7.

FIG. 17 shows assembly 102 which is formed from assembly 98. Over pad metallization (OPM) layers 104 are formed over the pads using any of the processes and materials described above for the double-sided structures. In the representative example shown in FIG. 17 the OPM layers include a nickel layer 106 deposited over the pad and a diffusion barrier layer 108 deposited over the nickel layer. The nickel layer may be electrolessly deposited, and if the diffusion barrier layer is formed of gold or silver it may likewise be electrolessly deposited. If the diffusion barrier layer is formed of an OSP it may be spun on or otherwise coated over the nickel layer. In the representative example the diffusion barrier layer is formed of gold so that the structure has an Ni/Au configuration. In other implementations an Ni/Pd/Au configuration may be used, as described previously with respect to other assemblies.

Figure 18:
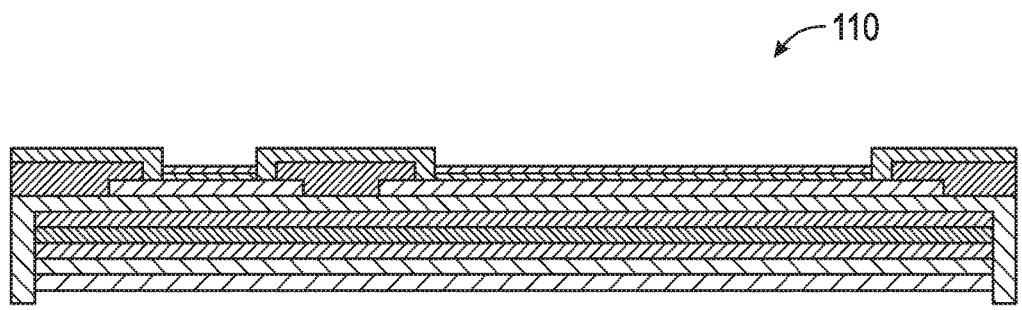
FIG. 18 is a side cross-section view of another semiconductor assembly formed in the formation of the semiconductor assembly of FIG. 7.
Figure 19:
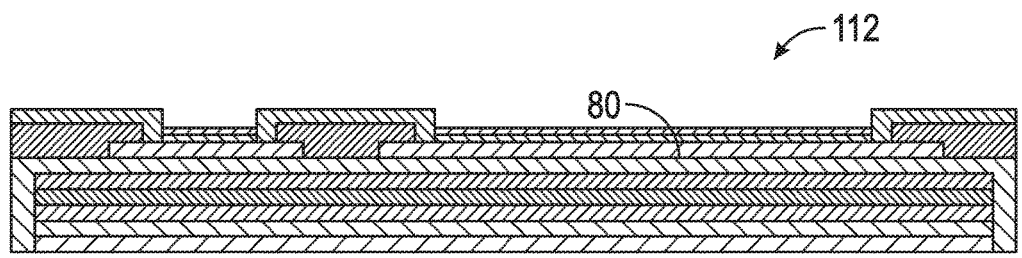
FIG. 19 is a side cross-section view of an implementation of a semiconductor assembly that has the same structure as the assembly of FIG. 7.

FIG. 18 shows assembly 110 which is formed from assembly 102 by removing the protective coating 100. If the protective coating is a UV release tape, for example, the tape may be exposed to UV and then removed. If the protective coating is some other material it may be removed through etching, grinding, etc. FIG. 19 shows assembly 112 which is formed from assembly 110 by removing (such as through sawing/grinding) the portions of the TAIKO ring which extend below the BM layers. The semiconductor layer 80 of the completed assembly 112 (which is identical or very similar to assembly 30 of FIG. 7) thus includes a horizontal portion and still includes a portion of the TAIKO ring that at least partially encloses the BM layers. The assembly 112/30 is thus ready for singulation. The OPM layers 66, including nickel layer 68 and diffusion barrier layer 70, of FIG. 7, in implementations are identical or very similar to the OPM layers 104, including nickel layer 106 and diffusion barrier layer 108, of FIG. 19.

In experiments with the tape and tape removal processes protection tape lamination was placed on 5.25 mil thick wafers having an Al/Ti/Ni/Ag BM layer configuration, and electroless Ni/Au OPM layers were deposited without the tape peeling. The protection tape was then successfully removed after the electroless Ni/Au deposition with no damage. This process was also completed on a dummy wafer having no BM layers similarly with no peeling and no damage. In these experiments the Ni/Au OPM layer was 1.6 microns thick.

One of the advantages of having the Ti/Ni/Ag BM structure (or a similar structure with Ag as a bottommost layer) is that it may allow for not only wirebonding and soldering, but also for Ag sintering to form a bond between the BM layers and some other device/element/motherboard or the like. As may be seen, however, the single-sided electroless process (with electroless deposition at the top side but evaporation and a protective coating used at the back side or first side) involves a somewhat longer and more complicated process, and may be more costly.

Another implementation, not shown in the drawings but described here briefly, involves using a copper OPM layer directly over the AlCu pads, the copper layer having a thickness of over 30 microns. The copper layer is thus available for soldering and sintering connections and/or may be used to support a heavy Cu wire.

After singulation the individual semiconductor devices may be included in any package type for final use, such as a leadless package, a leaded package, a molded package, and so forth. Appendix A, for example, which is incorporated herein by reference, discloses a four-lead packaged IGBT sold by ON Semiconductor of Phoenix, Ariz., and any of the semiconductor devices formed using any of the processes described herein could be included in a similar package or in a different package type.

In implementations using the metallization and other layers described herein may increase the reliability of semiconductor devices such as IGBTs and diodes (such as FRDs). In implementations the structures and processes described herein are useful for forming OPM layers and BM layers that will not diffuse at high temperatures (such as Ni/Au structures). Nevertheless, in implementations the OPM and BM layers are added after annealing so as to avoid diffusion of these layers (or of other materials into these layers) during annealing.

In places where the description above refers to particular implementations of semiconductor backmetal (BM) and over pad metallization (OPM) structures and related methods and implementing components, sub-components, methods and sub-methods, it should be readily apparent that a number of modifications may be made without departing from the spirit thereof and that these implementations, implementing components, sub-components, methods and sub-methods may be applied to other semiconductor backmetal (BM) and over pad metallization (OPM) structures and related methods.

What is claimed is:

1. A method of forming a plurality of semiconductor devices, comprising: providing a semiconductor wafer having a first side and a second side opposite the first side, one or more electrically conductive pads coupled at the second side, and one or more electrically insulative layers coupled at the second side and having one or more openings providing access to the one or more electrically conductive pads; backgrinding the first side of the wafer to a desired thickness; depositing an electrically conductive layer on the first side of the wafer; simultaneously electrolessly depositing a first nickel layer over the electrically conductive layer and a second nickel layer over the one or more electrically conductive pads, and; simultaneously depositing a first diffusion barrier layer over the first nickel layer and a second diffusion barrier layer over the second nickel layer.

2. The method of claim 1, wherein backgrinding the first side of the wafer comprises forming a substantially circular recess in the first side of the wafer bounded by a ring of non-removed material.

3. The method of claim 1, wherein the first diffusion barrier layer and the second diffusion barrier layer each comprises one of electrolessly deposited gold and electrolessly deposited silver.

4. The method of claim 1, wherein the first diffusion barrier layer and the second diffusion barrier layer each comprises an organic solderability preservative (OSP).

5. The method of claim 1, wherein the one or more electrically insulative layers comprises polyimide.

6. The method of claim 1, further comprising introducing dopants into the wafer through the first side of the wafer and annealing the wafer.

7. The method of claim 1, wherein the electrically conductive layer comprises AlCu.

8. The method of claim 1, further comprising forming one of a plurality of insulated gate bipolar transistors (IGBTs) and a plurality of diodes on the wafer.

9. A method of forming a plurality of semiconductor devices, comprising:
providing a semiconductor wafer having a first side and a second side opposite the first side, one or more electrically conductive pads coupled at the second side, and one or more electrically insulative layers coupled at the second side and having one or more openings providing access to the one or more electrically conductive pads; backgrinding the first side of the wafer to a desired thickness; depositing an electrically conductive layer on the first side of the wafer; depositing one or more backmetal (BM) layers on the electrically conductive layer, the one or more BM layers comprising one of a titanium layer, a nickel layer, and a silver layer; covering the one or more BM layers with a protective coating; electrolessly depositing a nickel layer over the one or more electrically conductive pads; depositing a diffusion barrier layer over the nickel layer, and; removing the protective coating from the one or more BM layers.

10. The method of claim 9, wherein the one or more BM layers comprises a titanium layer, a nickel layer, and a silver layer.

11. The method of claim 9, wherein the diffusion barrier layer comprises one of electrolessly deposited gold, electrolessly deposited silver, and an organic solderability preservative (OSP).

12. The method of claim 9, further comprising introducing dopants into the wafer through the first side of the wafer.

13. The method of claim 9, wherein the electrically conductive layer comprises evaporated aluminum.

14. The method of claim 9, wherein the protective coating comprises an adhesive tape.

15. The method of claim 9, further comprising depositing the one or more BM layers through evaporation.

* * * * *